United States Patent
Formato

(10) Patent No.: US 7,029,798 B1
(45) Date of Patent: Apr. 18, 2006

(54) ULTRASONIC AGITATION-ASSISTED DEVELOPMENT OF RESIST LAYER OF MASTER STAMPER/IMPRINTER

(75) Inventor: Christopher Formato, Brentwood, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 208 days.

(21) Appl. No.: 10/602,881

(22) Filed: Jun. 25, 2003

Related U.S. Application Data

(60) Provisional application No. 60/392,832, filed on Jun. 28, 2002.

(51) Int. Cl.
  *G03C 5/00* (2006.01)

(52) U.S. Cl. .......................... 430/3; 430/296; 430/322; 430/325; 430/326; 430/331; 430/942; 430/945; 134/1; 134/1.3

(58) Field of Classification Search .................... 430/3, 430/296, 322, 325, 326, 331, 942, 945; 134/1, 134/1.3
See application file for complete search history.

(56) References Cited

U.S. PATENT DOCUMENTS

| | | | |
|---|---|---|---|
| 3,551,157 A | 12/1970 | Salminen | |
| 4,447,510 A | 5/1984 | Frass et al. | |
| 4,612,267 A | 9/1986 | Heitmann et al. | |
| 4,652,106 A | 3/1987 | Jürgensen et al. | |
| 4,672,012 A | 6/1987 | Heitmann et al. | |
| 5,294,505 A | 3/1994 | Kamon | |
| 5,650,251 A | 7/1997 | Ishiwata et al. | |
| 5,876,875 A | 3/1999 | Chiu | |
| 6,372,389 B1 | 4/2002 | Watanabe | |
| 6,565,763 B1 * | 5/2003 | Asakawa et al. | 216/56 |

* cited by examiner

*Primary Examiner*—Christopher G. Young
(74) *Attorney, Agent, or Firm*—McDermott Will & Emery LLP

(57) ABSTRACT

A method of forming a topographical pattern in a surface of a resist layer, comprising sequential steps of:
  (a) providing a substrate having a surface;
  (b) forming a desired thickness resist material layer on the substrate surface;
  (c) subjecting selected areas of the surface of the resist layer to exposure to an energy beam to form therein a latent image of a desired topographical pattern to be formed therein;
  (d) contacting the surface of the resist layer with a liquid developing solution comprising a preselected solvent for developing the latent image into the desired topographical pattern while simultaneously supplying ultrasonic energy thereto, the combination of supplying the ultrasonic energy to the preselected solvent providing an increased developing interval and improved image contrast between the exposed and unexposed areas of the layer of resist material, relative to when the liquid developing solution does not comprise the preselected solvent and the ultrasonic energy is not supplied thereto.

12 Claims, 4 Drawing Sheets

ULTRASONIC AGITATION-ASSISTED DEVELOPMENT OF RESIST LAYER OF MASTER STAMPER/IMPRINTER

CROSS-REFERENCE TO PROVISIONAL APPLICATION

This application claims priority from U.S. provisional patent application Ser. No. 60/392,832 filed Jun. 28, 2002, the entire disclosure of which is incorporated herein by reference.

FIELD OF THE INVENTION

The present invention relates to a method for increasing the contrast between exposed and unexposed regions of a resist layer, and to a method for making an improved "master" employed in a process of forming magnetic stampers/imprinters for use in performing rapid, cost-effective patterning, e.g., servo patterning, of magnetic and magneto-optical (MO) recording media in hard disk form.

BACKGROUND OF THE INVENTION

Magnetic and magneto-optical (MO) recording media are widely used in various applications, e.g., in hard disk form, particularly in the computer industry, for storage and retrieval of large amounts of data/information. Typically such media require pattern formation in the major surface(s) thereof for facilitating operation, e.g., servo pattern formation for enabling positioning of the read/write transducer head over a particular data band or region.

Magnetic and magneto-optical (MO) recording media are conventionally fabricated in thin film form; the former are generally classified as "longitudinal" or "perpendicular", depending upon the orientation (i.e., parallel or perpendicular) of the magnetic domains of the grains of the magnetic material constituting the active magnetic recording layer, relative to the surface of the layer.

In operation of magnetic media, the magnetic layer is locally magnetized by a write transducer or write head to record and store data/information. The write transducer creates a highly concentrated magnetic field which alternates direction based on the bits of information being stored. When the local magnetic field applied by the write transducer is greater than the coercivity of the recording medium layer, then the grains of the polycrystalline magnetic layer at that location are magnetized. The grains retain their magnetization after the magnetic field applied by the write transducer is removed. The direction of the magnetization matches the direction of the applied magnetic field. The pattern of magnetization of the recording medium can subsequently produce an electrical response in a read transducer, allowing the stored medium to be read.

A typical contact start/stop (CSS) method employed during use of disk-shaped recording media, such as the above-described thin-film magnetic recording media, involves a floating transducer head gliding at a predetermined distance from the surface of the disk due to dynamic pressure effects caused by air flow generated between mutually sliding surfaces of the transducer head and the disk. During reading and recording (writing) operations, the transducer head is maintained at a controlled distance from the recording surface, supported on a bearing of air as the disk rotates, such that the transducer head is freely movable in both the circumferential and radial directions, thereby allowing data to be recorded and retrieved from the disk at a desired position in a data zone.

Adverting to FIG. 1, shown therein, in simplified, schematic plan view, is a magnetic recording disk 30 (of either longitudinal or perpendicular type) having a data zone 34 including a plurality of servo tracks, and a contact start/stop (CSS) zone 32. A servo pattern 40 is formed within the data zone 34, and includes a number of data track zones 38 separated by servo tracking zones 36. The data storage function of disk 30 is confined to the data track zones 38, while servo tracking zones 36 provide information to the disk drive which allows a read/write head to maintain alignment on the individual, tightly-spaced data tracks.

Although only a relatively few of the servo tracking zones are shown in FIG. 1 for illustrative simplicity, it should be recognized that the track patterns of the media contemplated herein may include several hundreds of servo zones to improve head tracking during each rotation of the disk. In addition, the servo tracking zones need not be straight radial zones as shown in the figure, but may instead comprise arcs, intermittent zones, or irregularly-shaped zones separating individual data tracks.

In conventional hard disk drives, data is stored in terms of bits along the data tracks. In operation, the disk is rotated at a relatively high speed, and the magnetic head assembly is mounted on the end of a support or actuator arm, which radially positions the head on the disk surface. If the actuator arm is held stationary, the magnetic head assembly will pass over a circular path on the disk, i.e., over a data track, and information can be read from or written to that track. Each concentric track has a unique radius, and reading and writing information from or to a specific track requires the magnetic head to be located above that track. By moving the actuator arm, the magnetic head assembly is moved radially on the disk surface between tracks. Many actuator arms are rotatable, wherein the magnetic head assembly is moved between tracks by activating a servomotor which pivots the actuator arm about an axis of rotation. Alternatively, a linear actuator may be used to move a magnetic head assembly radially inwardly or outwardly along a straight line.

As has been stated above, to record information on the disk, the transducer creates and applies a highly concentrated magnetic field in close proximity to the magnetic recording medium. During writing, the strength of the concentrated magnetic field directly under the write transducer is greater than the coercivity of the recording medium, and grains of the recording medium at that location are magnetized in a direction which matches the direction of the applied magnetic field. The grains of the recording medium retain their magnetization after the magnetic field is removed. As the disk rotates, the direction of the writing magnetic field is alternated, based on bits of the information being stored, thereby recording a magnetic pattern on the track directly under the write transducer.

On each track, eight "bits" typically form one "byte" and bytes of data are grouped as sectors. Reading or writing a sector requires knowledge of the physical location of the data in the data zone so that the servo-controller of the disk drive can accurately position the read/write head in the correct location at the correct time. Most disk drives use disks with embedded "servo patterns" of magnetically readable information. The servo patterns are read by the magnetic head assembly to inform the disk drive of track location. In conventional disk drives, tracks typically include both data sectors and servo patterns and each servo pattern typically includes radial indexing information, as well as a "servo burst". A servo burst is a centering pattern to precisely position the head over the center of the track. Because of the locational precision needed, writing of servo patterns requires expensive servo-pattern writing equipment and is a time consuming process.

Commonly assigned, co-pending U.S. patent application Ser. No. 10/082,178, filed Feb. 26, 2002, the entire disclosure of which is incorporated herein by reference, discloses a method and apparatus for reliably, rapidly, and cost-effectively forming very sharply defined magnetic transition patterns in a magnetic medium containing a longitudinal or perpendicular type magnetic recording layer without requiring expensive, complicated servo writing equipment/techniques incurring long processing intervals.

Specifically, the invention disclosed in U.S. patent application Ser. No. 10/082,178 is based upon recognition that a stamper/imprinter, comprised of a magnetic material having a high saturation magnetization, $B_{sat}$, i.e., $B_{sat} \geq$ about 0.5 Tesla, and a high permeability, $\mu$, i.e., $\mu \geq$ about 5, e.g., selected from Ni, NiFe, CoNiFe, CoSiFe, CoFe, and CoFeV, can be effectively utilized as a contact "stamper/imprinter" for contact "imprinting" of a magnetic transition pattern, e.g., a servo pattern, in the surface of a magnetic recording layer of a magnetic medium ("workpiece"), whether of longitudinal or perpendicular type. A key feature of this invention is the use of a stamper/imprinter having an imprinting surface including a topographical pattern, i.e., comprised of projections and depressions corresponding to a desired magnetic transition pattern, e.g., a servo pattern, to be formed in the magnetic recording layer. An advantage afforded by the invention is the ability to fabricate the topographically patterned imprinting surface of the stamper/imprinter, as well as the substrate or body therefor, of a single material, as by use of well-known and economical electro-forming techniques.

According to the invention, the magnetic domains of the magnetic recording layer of the workpiece are first unidirectionally aligned (i.e., "erased" or "initialized"), as by application of a first external, unidirectional magnetic field $H_{initial}$ of first direction and high strength greater than the saturation field of the magnetic recording layer, typically $\geq 2,000$ and up to about 20,000 Oe. The imprinting surface of the stamper/imprinter is then brought into intimate (i.e., touching) contact with the surface of the magnetic recording layer. With the assistance of a second externally applied magnetic field of second, opposite direction and lower but appropriate strength $H_{re-align}$, determined by $B_{sat}/\mu$ of the stamper material (typically $\geq 100$ Oe, e.g., from about 2,000 to about 4,500 Oe), the alignment of the magnetic domains at the areas of contact between the projections of the imprinting surface of the stamper/imprinter (in the case of perpendicular recording media, as schematically illustrated in FIG. 2) or at the areas facing the depressions of the imprinting surface of the stamper/imprinter (in the case of longitudinal recording media, as schematically illustrated in FIG. 3) and the magnetic recording layer of the workpiece is selectively reversed, while the alignment of the magnetic domains at the non-contacting areas (defined by the depressions in the imprinting surface of the stamper/imprinter) or at the contacting areas, respectively, is unaffected, whereby a sharply defined magnetic transition pattern is created within the magnetic recording layer of the workpiece to be patterned which essentially mimics the topographical pattern of projections and depressions of the imprinting surface. According to the invention, high $B_{sat}$ and high $\mu$ materials are preferred for use as the stamper/imprinter in order to: (1) avoid early magnetic saturation of the stamper/imprinter at the contact points between the projections of the imprinting surface and the magnetic recording layer, and (2) provide an easy path for the magnetic flux lines which enter and/or exit at the side edges of the projections.

Stampers/imprinters for use in a typical application, e.g., servo pattern formation in the recording layer of a disk-shaped, thin film, longitudinal or perpendicular magnetic recording medium comprise an imprinting surface having topographical features consisting of larger area data zones separated by smaller areas with well-defined patterns of projections and depressions corresponding to conventionally configured servo sectors, as for example, disclosed in commonly assigned U.S. Pat. No. 5,991,104, the entire disclosure of which is incorporated herein by reference. For example, a suitable topography for forming the servo sectors may comprise a plurality of projections (alt. depressions) having a height (alt. depth) in the range from about 100 to about 500 nm, a width in the range from about 50 to about 500 nm, and a spacing in the range from about 50 to about 500 nm.

According to conventional methodology, stampers/imprinters suitable for use in performing the foregoing patterning processes are manufactured by a sequence of steps as schematically illustrated in cross-sectional view in FIG. 4, which steps include providing a "master" comprised of a substantially rigid substrate with a patterned layer of a resist material thereon, the pattern comprising a plurality of projections and depressions corresponding (in positive or negative image form, as necessary) to the desired pattern to be formed in the surface of the stamper/imprinter.

Stampers/imprinters are made from the "master" by initially forming a thin, conformal layer of an electrically conductive material over the patterned resist layer and then electroforming a substantially thicker ("blanket") magnetic layer (of the aforementioned magnetic metals and/or alloys) on the thin layer of electrically conductive material, which electroformed blanket layer replicates the surface topography of the resist layer. Upon completion of the electroforming process, the stamper/imprinter is separated from the "master" to form a "father" stamper/imprinter. After passivation of the electroformed surface of the "father" stamper/imprinter, as by formation thereon of an oxide layer, an inverse electroformed structure, termed a "mother", is produced and separated therefrom. The process is then repeated to generate a "son" from the "mother". Each "master" stamper/imprinter can produce one "father"; each "father" can produce several "mothers"; and each "mother" can produce several "sons". The "father" and "son" stampers/imprinters are of the same physical "polarity" (e.g., positive) with regard to the arrangement of projections and depressions, and are of opposite "polarity" to that of the "master" and "mother" (e.g., negative). The "sons" are typically utilized as stampers/imprinters in the above-described process for contact patterning of magnetic media. The "fathers" may be similarly utilized for patterning of magnetic media.

According to conventional processing methodology utilized for manufacturing the above-described "master" with topographically patterned resist layer, an about 100 to about 500 nm thick layer of a resist material, e.g., Shipley UV3 or Nippon Zeon ZEP 520A-7 (Nippon Chemicals, Louisville, Ky.), is formed on a planarized surface of a substantially rigid substrate, e.g., of metal, metal alloy, glass, ceramic, glass-ceramic composite, etc., and selected areas of the surface of the resist layer subjected to exposure to an energy beam, e.g., an e-beam or laser beam, to form a latent image therein (to a prescribed depth) corresponding to a topographical pattern to be formed (to the prescribed depth) in the surface of the resist layer upon development. As indicated supra, a typical topographical pattern for use in contact printing servo sectors/patterns in magnetic and/or magneto-optical (MO) recording media may comprise a plurality of projections (alt. depressions) having a height (alt. depth) in the range from about 100 to about 500 n, a width in the range from about 50 to about 500 nm, and a spacing in the range from about 50 to about 500 nm.

Development of the latent image typically comprises immersing the resist layer in a solution of a suitable (i.e., conventional) solvent, e.g., n-amyl acetate (ZEP-N50 developer, Nippon Chemicals, Louisville, Ky.) for the resist layer (e.g., ZEP 520A-7) for an interval sufficient to effect removal of the portions of the resist layer which are soluble in the solvent or rendered soluble in the developing solvent by the selective exposure to the energy beam.

Disadvantageously, however, the above-mentioned resist materials frequently exhibit surface staining and poor pattern replication fidelity upon developing, including, inter alia, varying feature geometries and poor contrast between exposed and unexposed regions, attributed to very short development intervals, e.g., on the order of several seconds. As a consequence, stampers/imprinters fabricated from "masters" manufactured according to conventional technology (such as described in FIG. 4) and involving short solvent developing intervals similarly exhibit poor pattern replication fidelity, i.e., varying feature geometries and poor contrast between exposed and unexposed regions.

In view of the above-described difficulty in manufacturing high quality "masters" which faithfully replicate the exposure pattern provided by the energy beam, there exists a clear need for improved techniques and methodologies enabling manufacture of high quality masters of high replication fidelity. The present invention, therefore, addresses and solves the aforementioned problems and difficulties associated with the use of solvent developing techniques for forming desired high contrast topographical patterns in the surfaces of resist layers, while maintaining full compatibility with all other aspects of magnetic stamper/imprinter manufacture.

DISCLOSURE OF THE INVENTION

An advantage of the present invention is an improved method for forming a topographical pattern in a surface of a resist layer.

Another advantage of the present invention is an improved method of manufacturing a topographically patterned master for use in making therefrom at least one magnetic stamper/imprinter utilized for patterning of magnetic recording media by means of a contact printing process.

Still another aspect of the present invention is a structure comprised of a substrate with resist layer thereon, the resist layer having an improved contrast topographically patterned surface.

A still further aspect of the present invention is an improved master for making therefrom at least one magnetic stamper/imprinter utilized for patterning of magnetic recording media by means of a contact printing process.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a method of forming a topographical pattern in a surface of a resist layer, comprising sequential steps of:

(a) providing a substrate having a surface;
(b) forming a layer of a resist material of a desired thickness on the substrate surface, the resist layer having an exposed upper surface;
(c) subjecting selected areas of the exposed upper surface of the resist layer to exposure to an energy beam to form therein a latent image of a desired topographical pattern to be formed in the resist layer;
(d) contacting the exposed upper surface of the resist layer with a liquid developing solution comprising a preselected solvent for developing the latent image into the desired topographical pattern, and simultaneously supplying ultrasonic energy to the solution, the combination of supplying the ultrasonic energy to the liquid developing solution comprising the preselected solvent providing improved image contrast between the selected, exposed areas and unexposed areas of the resist layer, relative to when the liquid developing solution does not comprise the preselected solvent and ultrasonic energy is not supplied thereto.

According to embodiments of the present invention, step (a) comprises providing a substrate made of a material selected from the group consisting of: metal, metal alloy, glass, ceramic, glass-ceramic composite, and laminates of two or more of the aforementioned materials.

Alternative embodiments of the present invention include those wherein step (b) comprises forming a layer of a positive resist material and step (c) comprises forming soluble areas in the resist layer corresponding to the selected areas thereof subjected to exposure to the energy beam; or wherein step (b) comprises forming a layer of a negative resist material and step (c) comprises forming insoluble areas in the resist layer corresponding to areas thereof subjected to exposure to the energy beam.

Preferred embodiments of the present invention include those wherein step (b) comprises forming a layer of a positive e-beam resist material; step (e) comprises forming soluble areas in the resist layer corresponding to the selective areas thereof subjected to exposure to an e-beam; and step (d) comprises contacting the exposed upper surface of the resist layer with a liquid developing solution comprising a solvent comprised of 50 vol. % isopropyl alcohol (IPA) and 50 vol. % de-ionized (DI) water, and the interval for developing the latent image is increased from several seconds to tens of minutes, e.g., 15–30 min. at room temperature, relative to when the liquid developing solution is comprised of a solvent comprising n-amyl acetate and the ultrasonic energy is not supplied thereto; and the ultrasonic energy is supplied at a frequency of about 40 kHz and an intensity of about 185 W.

According to embodiments of the present invention, step (c) comprises subjecting the selected areas of the exposed upper surface of the resist layer to exposure to an electron beam or a laser beam, wherein step (c) further comprises selecting at least one of the intensity, energy, and dwell time of the electron or laser beam to form the latent image of the topographical pattern within the resist layer.

Preferred embodiments of the present invention include those wherein steps (a)–(d) together comprise a method of manufacturing a master for a magnetic stamper/imprinter utilized for patterning of magnetic recording media by means of a contact printing process, and the preferred embodiments of the present invention include those wherein step (c) comprises forming a latent image of a servo pattern for a disk-shaped magnetic recording medium, and step (d)

comprises developing the latent image within the resist layer to form a topographical pattern in the exposed surface of the resist layer comprised of a plurality of depressions having a depth in the range from about 100 to about 500 nm a width in the range from about 50 to about 500 nm, and a spacing in the range from about 50 to about 500 nm.

Another aspect of the present invention is a structure comprising a substrate having a surface with a resist layer thereon, the resist layer having a topographically patterned exposed upper surface with improved contrast between projecting and recessed features of the topographical pattern, the topographically patterned surface formed by a process comprising sequential steps of:
  (a) providing a substrate having a surface;
  (b) forming a layer of a resist material of a desired thickness on the substrate surface, the resist layer having an exposed upper surface;
  (c) subjecting selected areas of the exposed upper surface of the resist layer to exposure to an energy beam to form therein a latent image of a desired topographical pattern to be formed in the resist layer;
  (d) contacting the exposed upper surface of the resist layer with a liquid developing solution comprising a solvent for developing the latent image into the desired topographical pattern, and simultaneously supplying ultrasonic energy to the solution, the combination of supplying the ultrasonic energy to the liquid developing solution comprising the preselected solvent providing improved image contrast between the selected, exposed areas and unexposed areas of the resist layer, relative to when the liquid developing solution does not comprise the preselected solvent and ultrasonic energy is not supplied thereto.

According to embodiments of the present invention, the substrate is made of a material selected from the group consisting of: metal, metal alloy, glass, ceramic, glass-ceramic composite, and laminates of two or more of the aforementioned materials; and the resist layer is comprised of a positive or negative resist material, e.g., an e-beam resist material.

Preferred embodiments of the present invention are those wherein the structure comprises a master for a magnetic stamper/imprinter utilized for patterning of magnetic recording media by means of a contact printing process, wherein the topographically patterned upper surface of the resist layer corresponds to a servo pattern to be formed in the surface of a disk-shaped magnetic recording medium, and the topographically patterned upper surface of the resist layer comprises a plurality of depressions having a depth in the range from about 100 to about 500 nm, a width in the range from about 50 to about 500 nm, and a spacing in the range from about 50 to about 500 nm.

Yet another aspect of the present invention is a method of increasing the interval necessary for developing a latent image formed to a desired depth in a layer of a resist material, comprising contacting the resist layer with a preselected liquid developing solvent while simultaneously supplying ultrasonic energy to the solvent, wherein the combination of supplying the ultrasonic energy to the preselected liquid developing solvent provides an increased developing interval and improved image contrast between the exposed and unexposed areas of the layer of resist material, relative to when the liquid developing solution does not comprise the preselected solvent and the ultrasonic energy is not supplied thereto.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, wherein.

DESCRIPTION OF THE INVENTION

The present invention addresses and solves problems and difficulties attendant upon the manufacture of topographically patterned "masters" utilized for forming a correspondingly topographically patterned magnetic stamper/imprinter, which problems and difficulties include, inter alia, surface staining, poor pattern replication fidelity, and poor contrast between projecting and recessed features of the resist layer. Specifically, the present invention substantially eliminates, or at least minimizes, the aforementioned problems and difficulties arising from the very short solvent development intervals (i.e., several seconds) associated with conventional technology for manufacturing "masters".

The invention is based upon the inventor's finding that improved image contrast is obtained and the intervals for solvent development of latent image-containing resist layers substantially and significantly increased by ultrasonic agitation of a developer solution comprised of a preselected solvent during the developing process. According to the invention, the slower, more favorable and better controlled resist dissolution kinetics afforded by use of the preselected solvent in combination with the ultrasonic agitation yield topographically patterned resist layers with no, or minimal surface staining, improved pattern replication fidelity, and improved contrast between exposed and unexposed regions, i.e., between projecting and depressed features of the topographical pattern.

Figure 5:
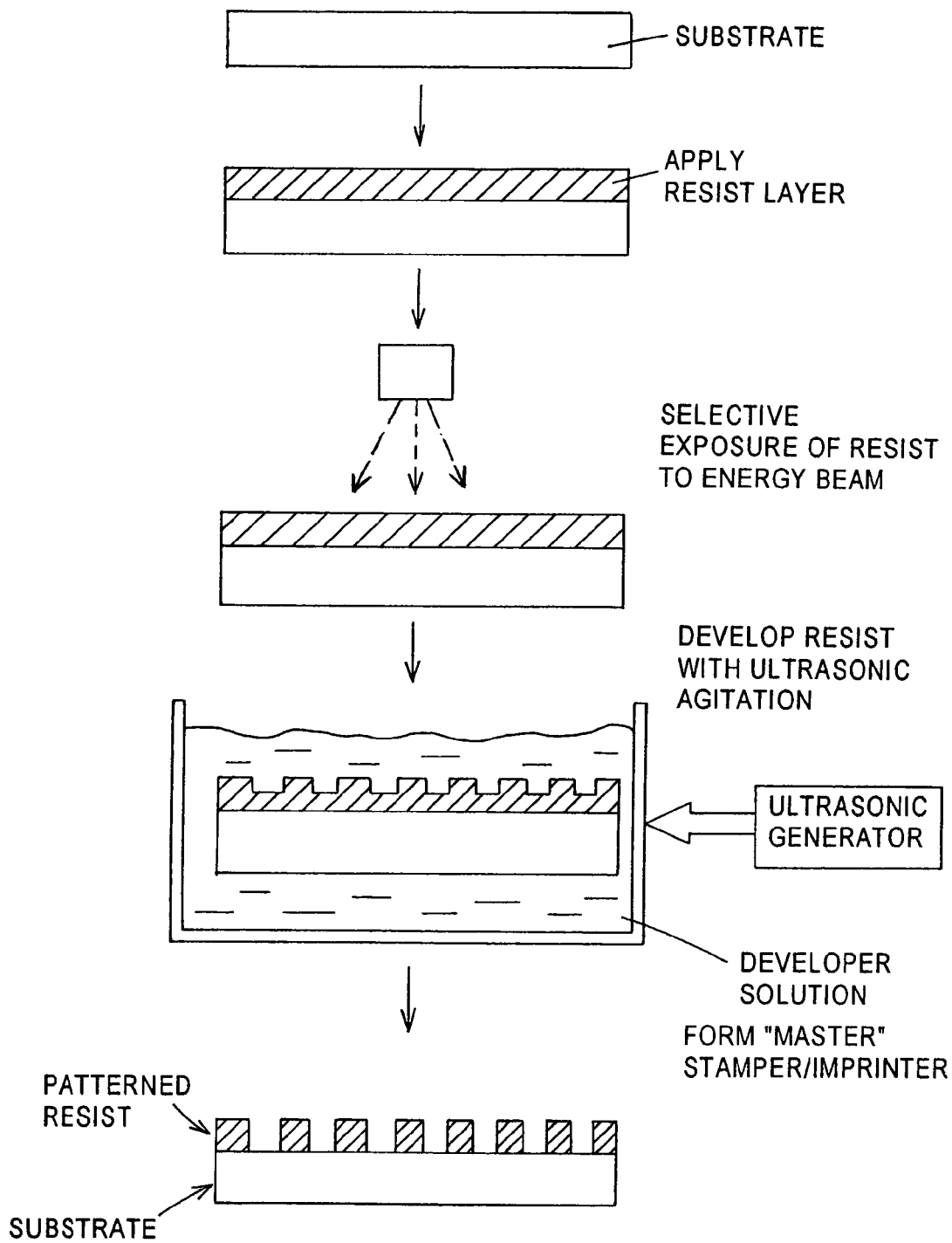
FIG. 5 schematically illustrates, in simplified cross-sectional view, a sequence of steps for forming a "master" for use in making therefrom a magnetic stamper/imprinter, according to the present invention.

Referring to FIG. 5, schematically illustrated therein, in simplified cross-sectional view, is a sequence of steps according to the present invention, for forming a "master" for use in making therefrom a magnetic stamper/imprinter. In initial steps according to the invention, shown in the first two views of FIG. 5, a substantially rigid substrate of a material selected from among metals, metal alloys, glass, glass-ceramic composites, and laminates of two or more of the aforementioned materials is provided, and a layer of a positive or negative resist material formed on a planarized surface (illustratively an upper surface) of the substrate, as by any conventional technique, e.g., spin coating.

According to the invention, the resist layer is formed to a sufficient thickness compatible with the feature requirements of the topographical pattern to be formed therein in subsequent processing. That is, the thickness of the resist layer should be at least equal to the maximum depth of any depression formed therein as a result of subsequent pattern formation processing. By way of illustration, but not limitation, suitable resist layer thicknesses for making masters for magnetic stampers/imprinters utilized in patterning of magnetic recording media by contact printing range from about 100 to about 500 nm and suitable resist materials for use in such applications include positive and negative e-beam and laser-beam resists.

In the next step according to the inventive methodology, illustrated in the middle view of FIG. 5, selected areas of the upper (i.e., exposed) surface of the resist layer are subjected to exposure to a scanned energy beam, e.g., an electron beam (e-beam) or a laser beam, to form a latent image of a desired topographical pattern to be formed in the resist layer. The depth to which the latent image is formed in each selected region of the resist layer is determined by the intensity, energy, and dwell time of the energy beam. According to the invention, when the resist layer is comprised of a positive resist material, the irradiated areas or regions of the resist layer comprising the latent image are rendered soluble in a developer solvent; whereas when the resist layer is comprised of a negative resist material, the irradiated regions of the resist layer comprising the latent image are rendered insoluble in the developer solvent.

By way of illustration, but not limitation, the latent image formed in the resist layer by selective irradiation may correspond to a servo pattern to be formed in the surface of a magnetic or magneto-optical (MO) recording medium, and the latent image, when developed into a topographical pattern in the surface of the resist layer, as by means of a suitable solvent, may comprise a plurality of depressions having a depth in the range from about 100 to about 500 nm, a width in the range from about 50 to about 500 nm, and spacings in the range from about 50 to about 500 nm.

In the next step according to the inventive methodology, shown in the fourth view of FIG. 5, the substrate with latent image-containing resist layer thereon is immersed in a vessel or container containing a developer solution comprised of a preselected solvent for the resist material, and, according to the invention, the vessel or container is equipped with means for providing ultrasonic agitation of the developer solution. The developer solution, comprised of a preselected solvent, with the substrate/latent image-containing resist layer immersed therein is then subjected to ultrasonic agitation at a suitable frequency and intensity to effect controlled dissolution of the solubilized areas of the latent image formed therein, wherein the interval for obtaining complete development of the latent image in the resist layer is increased from several second to several tens of minutes and image contrast is improved, resulting in a substantial reduction in staining and improved pattern replication fidelity, as evidenced by increased contrast between projecting and recessed pattern features, which improvements may be attributed to the slower, more controlled resist dissolution rates/kinetics afforded by the inventive methodology.

Figure 1:
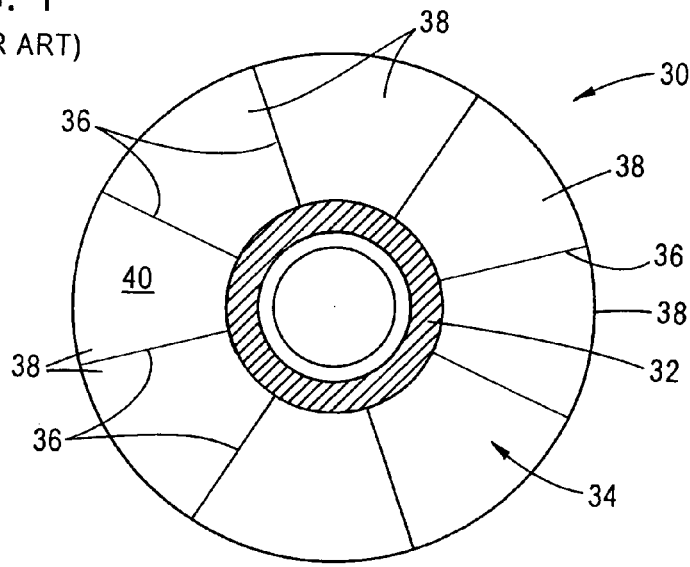
FIG. 1 illustrates in simplified, schematic plan view, a magnetic recording disk designating the data, servo pattern, and CSS zones thereof.
Figure 2:
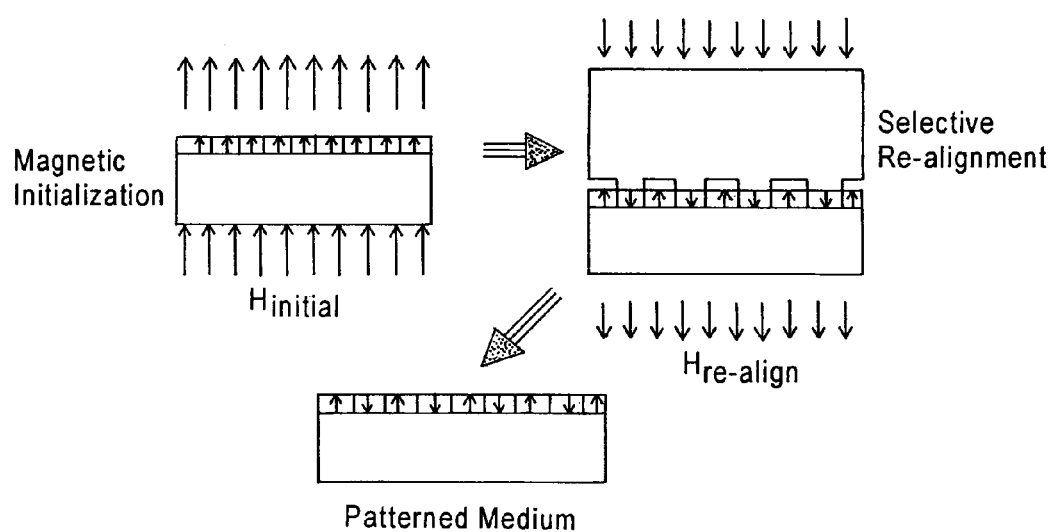
FIG. 2 illustrates, in schematic, simplified cross-sectional view, a sequence of process steps for contact printing a magnetic transition pattern in the surface of a perpendicular magnetic recording layer, utilizing a stamper/imprinter formed of a high saturation magnetization, high permeability magnetic material having an imprinting surface with a surface topography corresponding to the desired magnetic transition pattern.
Figure 3:
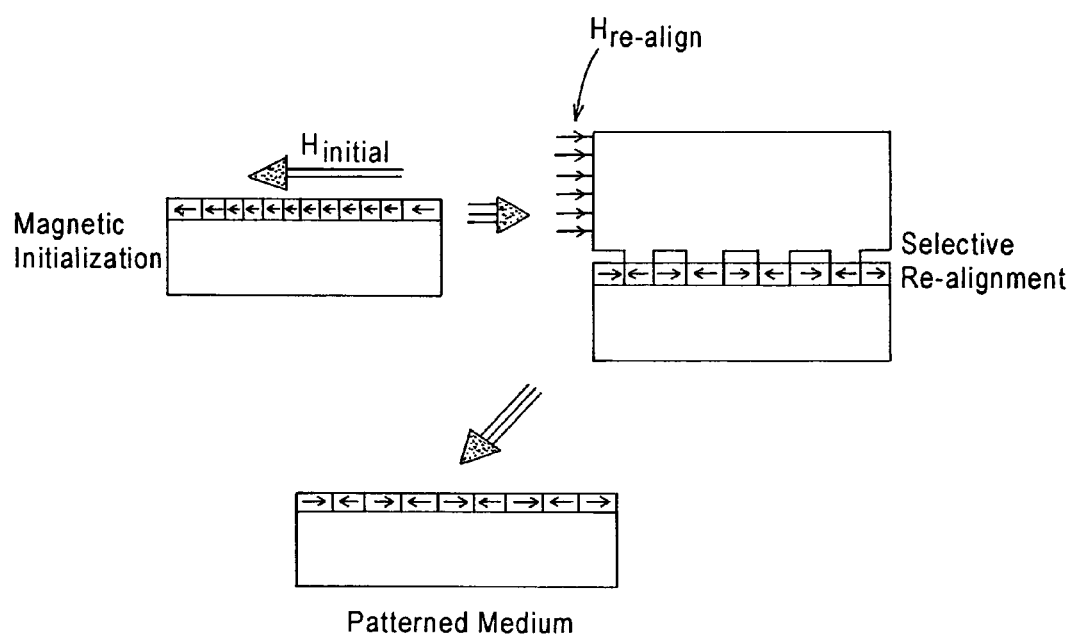
FIG. 3 illustrates, in schematic, simplified cross-sectional view, a similar sequence of process steps for contact printing a magnetic transition pattern in the surface of a longitudinal magnetic recording layer.
Figure 4:
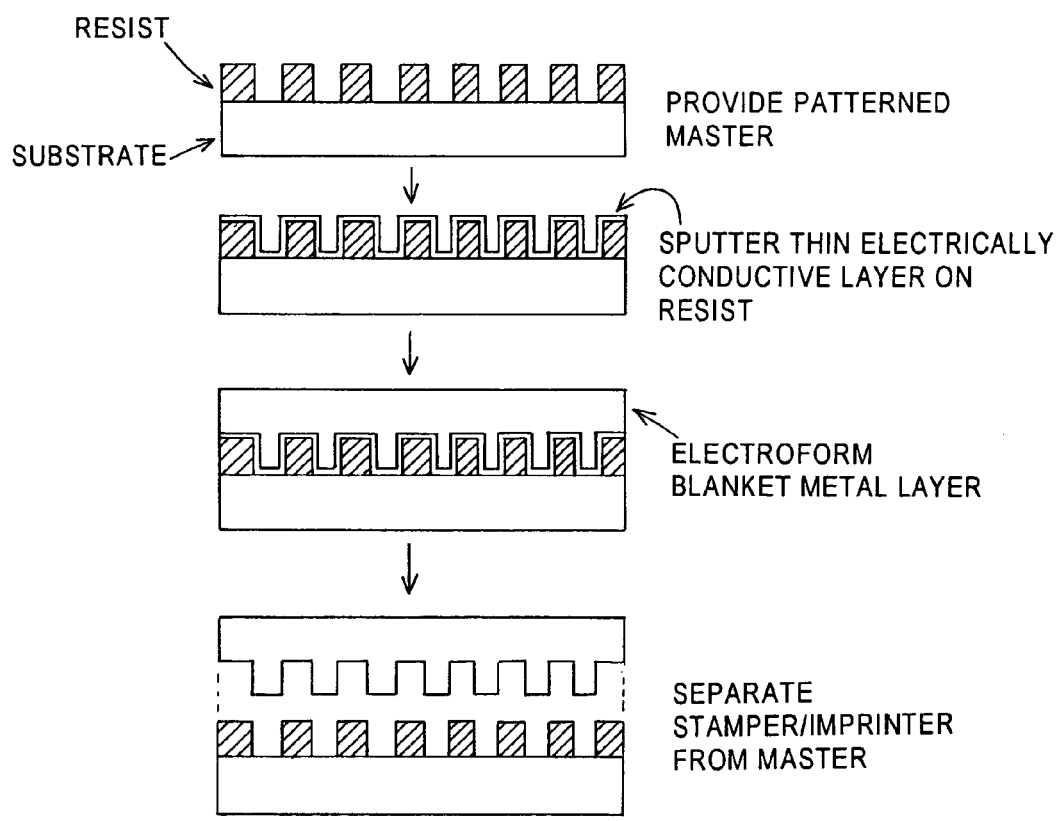
FIG. 4 schematically illustrates, in simplified cross-sectional view, a sequence of steps for forming a stamper/imprinter for recording media patterning, according to the conventional art.

The fully developed resist layer/substrate structure, shown in the last view of FIG. 5, may then be utilized as the "master" in the conventional process sequence of FIG. 4 for forming therefrom a plurality of magnetic stampers/imprinters for use in performing contact printing of magnetic patterns in the surfaces of magnetic and/or MO recording media, as illustrated in FIGS. 2–3.

EXAMPLE

A series of test specimens were prepared, each comprising a layer of a positive e-beam resist (Nippon Zeon ZEP 520A-7) on a metal substrate. Each specimen was then exposed to a scanned e-beam for creation of a latent image therein, followed by development of the latent image. Development times of the latent images in conventional n-amyl acetate (Nippon Zeon ZEP 520) solvent without ultrasonic agitation ranged from about 4 to about 8 sec., whereas development times (at room temperature) in a developer solution comprising a solvent comprised of 50 vol. % isopropyl alcohol (IPA) and 50 vol. % de-ionized (DI) water with ultrasonic agitation supplied thereto at 40 kHz and 185 W power ranged from about 15 to about 30 min. Microscopic analysis of the developed specimens indicated that those developed at the longer development times provided by the ultrasonic agitation of the developer solution exhibited improved contrast between projecting and depressed features, relative to the specimens developed without ultrasonic agitation.

The present invention thus affords a number of advantages and improvements in manufacturing "masters" utilized in forming magnetic stampers/imprinters for contact printing of magnetic recording media, including servo patterning, which improvements include, inter alia, elimination or substantial reduction in surface staining, improved replication fidelity, and increased contrast between projecting and recessed pattern features. In addition, according to the inventive methodology, the improved "masters" for magnetic stampers/imprinters are readily manufactured by conventional techniques.

It should be apparent to one of ordinary skill in the art that the present invention provides a significant improvement over the conventional art such as has been described above, particularly with respect to the ease and simplicity of manufacturing "masters" with high contrast between pattern features, in turn enabling formation therefrom of high pattern contrast, high replication fidelity magnetic stampers/imprinters for use in contact patterning, e.g., servo patterning, of a variety of magnetic and MO recording media. Further, the topographically patterned surfaces of the "masters" according to the invention can be formed with a wide variety of feature patterns, whereby the inventive methodology can be rapidly, easily, and cost-effectively implemented in the automated manufacture of a number of magnetic articles, devices, etc., requiring patterning, of which servo patterning of longitudinal and perpendicular magnetic recording media merely constitute examples of the versatility and utility of the invention.

In the previous description, numerous specific details are set forth, such as specific materials, structures, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of forming a topographical pattern in a surface of a resist layer, comprising sequential steps of:
    (a) providing a substrate having a surface;
    (b) forming a layer of a resist material of a desired thickness on said substrate surface, said resist layer having an exposed upper surface;
    (c) subjecting selected areas of said exposed upper surface of said resist layer to exposure to an energy beam to form therein a latent image of a desired topographical pattern to be formed in said resist layer;
    (d) contacting said exposed upper surface of said resist layer with a liquid developing solution comprising a preselected solvent for developing said latent image into said desired topographical pattern, and simultaneously supplying ultrasonic energy to said solution, the combination of supplying said ultrasonic energy to said liquid developing solution comprising said preselected solvent providing improved image contrast between the selected, exposed areas and unexposed areas of said resist layer and increasing an interval for developing said latent image from several seconds to tens of minutes, relative to when said liquid developing solution does not comprise said preselected solvent and said ultrasonic energy is not supplied thereto.

2. The method as in claim 1, wherein:
   step (a) comprises providing a substrate made of a material selected from the group consisting of: metal, metal alloy, glass, ceramic, glass-ceramic composite, and laminates of two or more of the aforementioned materials.

3. The method as in claim 1, wherein:
   step (b) comprises forming a layer of a positive resist material; and
   step (c) comprises forming soluble areas in said resist layer corresponding to said selected areas thereof subjected to exposure to said energy beam.

4. The method as in claim 1, wherein:
   step (b) comprises forming a layer of a negative resist material; and
   step (c) comprises forming insoluble areas in said resist layer corresponding to areas thereof subjected to exposure to said energy beam.

5. The method as in claim 1, wherein:
   step (c) comprises subjecting said selected areas of said exposed upper surface of said resist layer to exposure to an electron beam or a laser beam.

6. A method of forming a topographical pattern in a surface of a resist layer, comprising sequential steps of:
    (a) providing a substrate having a surface;
    (b) forming a layer of a resist material of a desired thickness on said substrate surface, said resist layer having an exposed upper surface;
    (c) subjecting selected areas of said exposed upper surface of said resist layer to exposure to an energy beam to form therein a latent image of a desired topographical pattern to be formed in said resist layer;
    (d) contacting said exposed upper surface of said resist layer with a liquid developing solution comprising a preselected solvent for developing said latent image into said desired topographical pattern, and simultaneously supplying ultrasonic energy to said solution, the combination of supplying said ultrasonic energy to said liquid developing solution comprising said preselected solvent providing improved image contrast between the selected, exposed areas and unexposed areas of said resist layer, relative to when said liquid developing solution does not comprise said preselected solvent and said ultrasonic energy is not supplied thereto, wherein
    said liquid developing solution comprises a solvent comprised of 50 vol. % isopropyl alcohol (IPA) and 50 vol. % de-ionized (DI) water, and the interval for developing said latent image is increased from several seconds to tens of minutes, relative to when said liquid developing solution is comprised of a solvent comprising n-amyl acetate and said ultrasonic energy is not supplied thereto.

7. The method as in claim 6, wherein:
   step (d) comprises supplying said ultrasonic energy at a frequency of about 40 kHz and an intensity of about 185 W.

8. The method as in claim 6, wherein:
   step (d) comprises increasing said developing interval from several seconds to about 15–30 min. at room temperature, relative to when said liquid developing solution is comprised of a solvent comprising n-amyl acetate and said ultrasonic energy is not supplied thereto.

9. The method as in claim 6, wherein:
   step (b) comprises forming a layer of a positive e-beam resist material;
   step (c) comprises forming soluble areas in said resist layer corresponding to said selected areas thereof subjected to exposure to an e-beam.

10. A method of forming a topographical pattern in a surface of a resist layer, comprising sequential steps of:
    (a) providing a substrate having a surface;
    (b) forming a layer of a resist material of a desired thickness on said substrate surface, said resist layer having an exposed upper surface;
    (c) subjecting selected areas of said exposed upper surface of said resist layer to exposure to an energy beam to form therein a latent image of a desired topographical pattern to be formed in said resist layer;
    (d) contacting said exposed upper surface of said resist layer with a liquid developing solution comprising a preselected solvent for developing said latent image into said desired topographical pattern, and simultaneously supplying ultrasonic energy to said solution, the combination of supplying said ultrasonic energy to said liquid developing solution comprising said preselected solvent providing improved image contrast between the selected, exposed areas and unexposed areas of said resist layer, relative to when said liquid developing solution does not comprise said preselected solvent and said ultrasonic energy is not supplied thereto, wherein steps (a)–(d) together comprise a method of manufacturing a master for a magnetic stamper/imprinter utilized for patterning of magnetic recording media by means of a contact printing process, wherein:

step (c) comprises forming a latent image of a servo pattern for a disk-shaped magnetic recording medium.

11. The method as in claim 10, wherein:

step (d) comprises developing said latent image within said resist layer to form a topographical pattern in said exposed surface of said resist layer comprised of a plurality of depressions having a depth in the range from about 100 to about 500 nm, a width in the range from about 50 to about 500 nm, and a spacing in the range from about 50 to about 500 nm.

12. A method of developing a latent image comprised of exposed and unexposed areas formed in a layer of a resist material, comprising contacting said resist layer with a preselected liquid developing solvent while simultaneously supplying ultrasonic energy to said solvent, wherein the combination of supplying said ultrasonic energy to said preselected liquid developing solvent provides an increased developing interval and improved image contrast between said exposed and unexposed areas of said layer of said resist material, relative to when said liquid developing solution does not comprise said preselected solvent and said ultrasonic energy is not supplied thereto.

* * * * *